US011303480B2

(12) United States Patent
Siddamurthy et al.

(10) Patent No.: US 11,303,480 B2
(45) Date of Patent: Apr. 12, 2022

(54) METHOD AND SYSTEM FOR PROVIDING AN EQUALIZER WITH A SPLIT FOLDED CASCODE ARCHITECTURE

(71) Applicant: SAMSUNG ELECTRONICS CO., LTD., Suwon-si (KR)

(72) Inventors: Subba Reddy Siddamurthy, Bangalore (IN); Venkatasuryam Setty Issa, Bangalore (IN); Aswani Aditya Kumar Tadinada, Bangalore (IN)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/094,078

(22) Filed: Nov. 10, 2020

(65) Prior Publication Data

US 2022/0078051 A1    Mar. 10, 2022

(30) Foreign Application Priority Data

Sep. 8, 2020   (IN) .............................. 202041038795

(51) Int. Cl.
*H04L 25/03* (2006.01)
*H03F 3/45* (2006.01)
*H04B 1/40* (2015.01)

(52) U.S. Cl.
CPC ... *H04L 25/03012* (2013.01); *H03F 3/45192* (2013.01); *H03F 3/45269* (2013.01); *H04B 1/40* (2013.01)

(58) Field of Classification Search
CPC ........... H04L 25/03012; H03F 3/45192; H03F 3/45269; H04B 1/40
See application file for complete search history.

(56) References Cited

U.S. PATENT DOCUMENTS 8,810,319 B1    8/2014 Chan et al.
9,397,623 B1    7/2016 Lacroix
(Continued)

FOREIGN PATENT DOCUMENTS

WO    WO 2019-155582 A1    8/2019

OTHER PUBLICATIONS

Nath, S., Laskar, N.M., Devi, S. et al. Design of low power preamplifier IC for cochlear implant using split folded cascode technique. Microsyst Technol 27, 3483-3491 (2021). https://doi.org/10.1007/s00542-020-05158-0. (Year: 2021).*

*Primary Examiner* — Nader Bolourchi
(74) *Attorney, Agent, or Firm* — Volentine, Whitt & Francos, PLLC

(57) ABSTRACT

An equalizer having a split folded cascode architecture includes a circuit having a differential pair with a single tail current source and split folded cascode branches. The single tail current source eliminates the input referred offset due to a mismatch in current sources. The folded cascode amplifier acts as the equalizer, which is split into a derivative path and a proportional path. The derivative path boosts the high frequency components of the received signal. The gain of the low frequency components of the received signal is adjusted by the proportional path. The derivative path includes variable capacitors and variable resistors which allow fixing a 'zero' frequency and peak gain frequency to a predetermined value, wherein frequencies greater than the 'zero' frequency are boosted. The proportional path includes variable resistors, which allow adjusting the low frequency gain without affecting the 'zero' frequency and peak gain frequency.

20 Claims, 6 Drawing Sheets

(56) References Cited

U.S. PATENT DOCUMENTS

| | | | |
|---|---|---|---|
| 9,467,313 B2 | 10/2016 | Bulzacchelli et al. | |
| 9,735,989 B1 | 8/2017 | Xie et al. | |
| 2004/0257160 A1* | 12/2004 | Wang | H03F 3/45192 |
| | | | 330/253 |
| 2018/0375694 A1 | 12/2018 | Liao et al. | |
| 2020/0382086 A1* | 12/2020 | Kano | H03F 1/086 |

* cited by examiner

PRIOR ART

METHOD AND SYSTEM FOR PROVIDING AN EQUALIZER WITH A SPLIT FOLDED CASCODE ARCHITECTURE

CROSS-REFERENCE TO RELATED APPLICATIONS

This application claims priority under 35 U.S.C. § 119 to Indian Patent Application No. 202041038795 filed on Sep. 8, 2020, in the Indian Intellectual Property Office, the disclosure of which is incorporated by reference herein in its entirety.

TECHNICAL FIELD

Embodiments herein relate to a continuous time linear equalizer, and more particularly to a method and system for providing an equalizer with a split-folded cascode architecture.

BACKGROUND

Currently, communication devices utilize a Continuous Time Linear Equalizer (CTLE) for treating received signals, which are likely to be affected by inter-symbol interference while traversing through high-speed communication channels. The communication channels generally have low-pass characteristics, due to which high frequency components of the signals are likely to be attenuated to a greater extent compared to low frequency components of the signals. The CTLE can boost the high frequency components of the signals, thereby balancing the gains of all frequency components of the received signals. The existing CTLE architectures may adversely affect the net input signal available for detection by the receiver due to an increase of input referred offset in the process of achieving low frequency to high frequency gain boosting.

FIG. 1 depicts a prior art architecture of a CTLE in a Metal Oxide Semiconductor Field Effect Transistor (MOSFET) differential pair. As depicted in FIG. 1, the differential pair comprises two legs. Each leg comprises a driving resistor $R_D$, a parallel capacitor $C_p$, MOSFET M1 (the other leg comprises MOSFET M2), and a current source I1 (the other leg comprises a current source I2). In an exemplary embodiment, the driving resistor is connected to the driving voltage $V_D$, and the parallel capacitor $C_p$. The other terminal of the parallel capacitor $C_p$ is connected to the ground. In an exemplary embodiment, input voltage Vin is provided to the gate terminal of the MOSFET M1 and M2, and Output voltage Vout is output through a node connected to the driving resistor $R_D$, and the MOSFET M1 (or M2).

The CTLE is included in the differential pair by splitting the tail current source I1 (or I2), which would otherwise be a common current source for the differential pair in the absence of the CTLE. The CTLE comprises a resistor $R_S$ and a capacitor $C_S$ connected in parallel. The MOSFETs $M_1$ and $M_2$ are of N-type and the resistor $R_S$ and capacitor $C_S$ are connected across the source terminals of the MOSFETs $M_1$ and $M_2$. The parallel combination of resistor $R_S$ and capacitor $C_S$ can boost the gain of high frequency components of a received signal. The boosting can be achieved by choosing a high value of resistor $R_S$. The impedance presented by capacitor $C_S$ to the high frequency components will be low. The combination can act as a high-pass filter, thereby increasing the gain of the high frequency components of the received signal.

However, the gain of the low frequency components of the signal will be curtailed if a high valued resistor $R_S$ is used. As the Direct Current (DC) gain of the architecture given in FIG. 1 is proportional to $g_{Meff}$ ($g_{Meff}$ is $g_M/1+g_M*R_S/2$, wherein $g_M$ is the transconductance of $M_1$ and $M_2$, which can be considered to be the same, and $g_{Meff}$ is the effective transconductance), choosing a high valued resistor $R_S$ can reduce the DC gain and the gain of the low frequency components. Further, the capacitor $C_S$ presents very high impedance to the low frequency components. Thus, the CTLE effectively reduces the low frequency gain while boosting that of the high frequencies.

The high value of resistor $R_S$ also causes source degeneration of $M_1$ and $M_2$ (i.e., reduces the effective $g_M$ of the differential pair to $g_{Meff}$). Source degeneration can increase the input referred offset, as it can lead to a mismatch between driving resistors $R_D$ in different legs of the differential pair. The mismatch is $I*(\Delta R_D/R_D)/g_{Meff}$ ($\Delta R_D$ is difference between the resistors in the left and right legs of the differential pair, and I1 (or I2) is the current flowing through the legs of the differential pair).

The presence of the CTLE requires the splitting of the tail current source used in the architecture. Due to the splitting of the tail current source, there is a possibility of mismatch between the tail current sources I, which in turn can contribute to the input referred offset: $\Delta I*R_S/2$ ($\Delta I$ is difference between the two tail current sources) There is no input referred offset if CTLE is not used. Because R is directly proportional to the input referred offset, an increase in $R_S$ can lead to an increase in the input referred offset.

SUMMARY

An object of the embodiments disclosed herein is to provide an equalizer having a split folded cascode architecture for boosting a gain of high frequency components of a received signal relative to low frequency components of the received signal without imposing source degeneration (thereby eliminating the input referred offset because of source degeneration).

Another object of the embodiments disclosed herein is to provide a derivative path and a proportional path, which splits the architecture of a folded cascode amplifier. The split achieves independent optimization of the gains of the high frequency components and the low frequency components of the received signal, respectively.

Another object of the embodiments disclosed herein is to reduce input referred offset in a receiver caused by arrangements of equalizers for boosting the gain of the high frequency components of the received signal. The input referred offset is reduced by preventing source degeneration in the differential pair and providing a single current source to the differential pair. Splitting of the current source and source degeneration are prevented by splitting the architecture of the folded cascode amplifier.

Another object of the embodiments disclosed herein is to improve the performance of an existing folded cascode amplifier based receiver/comparator non-intrusively by introducing variable capacitors in parallel to cascode MOSFETs at the folding node.

Accordingly, the embodiments provide an equalizer having a split folded cascode architecture for boosting the gain of high frequency components of a received signal. The embodiments include a circuit comprising a differential pair and a split folded cascode amplifier. A received signal can be input to the differential pair. The differential pair includes a single current source, which eliminates a mismatch between tail current sources manifested as an input referred offset. The folded cascode amplifier can be split into two parts—a derivative path and a proportional path. The embodiments include boosting the high frequency components of the received signal using the derivative path. The embodiments include adjusting the gain of the low frequency components of the received signal using the proportional path. The derivative path and the proportional path allow independent optimization of the gains of the high and low frequency components, respectively. The derivative path can include variable capacitors and resistors, and the proportional path can include variable resistors, which ensure that the 'zero' frequency and peak gain frequency are fixed and low frequency to high frequency gain boosting is adjusted for fixed 'zero' frequency and peak gain frequency.

These and other aspects of the embodiments herein will be better appreciated and understood when considered in conjunction with the following description and the accompanying drawings. It should be understood, however, that the following descriptions, while indicating embodiments and numerous specific details thereof, are given by way of illustration and not of limitation. Many changes and modifications may be made within the scope of the embodiments herein without departing from the spirit thereof.

BRIEF DESCRIPTION OF FIGURES

Embodiments herein are illustrated in the accompanying drawings, throughout which like reference letters indicate corresponding parts in the various figures. The embodiments herein will be better understood from the following description with reference to the drawings, in which.

DETAILED DESCRIPTION

Figure 1:
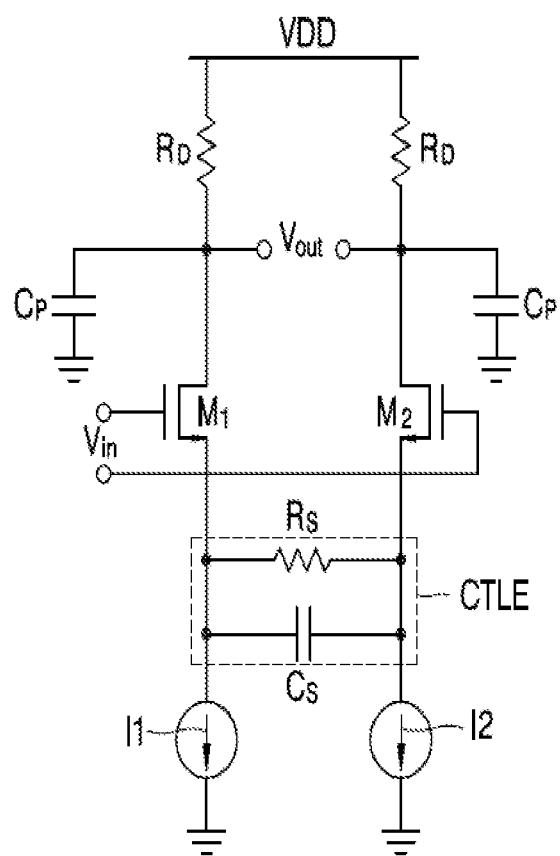
FIG. 1 depicts a related art example architecture of a Continuous Time Linear Equalizer (CTLE), which includes a differential pair comprising Metal Oxide Semiconductor Field Effect Transistors (MOSFETs)

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Embodiments herein disclose an equalizer having a split folded cascode architecture, which is used in receivers for boosting a gain of high frequency components of a signal. The embodiments include splitting the architecture of a folded cascode amplifier into two parts—a derivative path and a proportional path. The derivative path allows boosting of the gains of the high frequency components. The proportional path allows adjusting of the gain of low frequency components of the signal while the gain of the high frequency components is boosted by the derivative path. The derivative part can include variable capacitors and variable resistors and the proportional part can include variable resistors. The variable capacitors and the variable resistors can ensure that the 'zero' frequency and peak gain frequency are fixed and low frequency to high frequency gain boosting is adjusted for fixed 'zero' frequency and peak gain frequency.

The derivative path and the proportional path of the split folded cascode amplifier allow independent optimization of the gains of the high frequency components and the low frequency components of the received signal, respectively. The splitting of the architecture of the folded cascode amplifier prevents source degeneration in an input differential pair that receives an input signal. The split folded cascode architecture allows the differential pair to have a single current source, which eliminates input referred offset due to mismatch in tail current sources.

Referring now to the drawings, and more particularly to FIGS. 2A through 4, where similar reference characters denote corresponding features consistently throughout the figures, there are shown preferred embodiments.

Figure 2A:
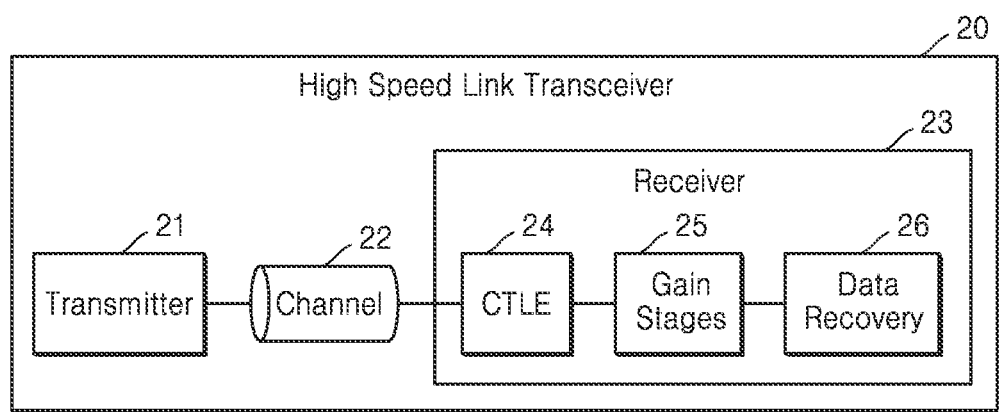
FIG. 2A is a block diagram depicting a simplified high-speed link transceiver system comprising a Continuous Time Linear Equalizer (CTLE) for boosting the high frequency components of a received signal.

FIG. 2A is a block diagram depicting a simplified high speed link transceiver 20 comprising a Continuous Time Linear Equalizer (CTLE) equalizer 24 for boosting a gain of high frequency components of a received signal. The high speed link transceiver 20 includes a transmitter 21 and a receiver 23. The high speed link transceiver 20 transmits and receives signals through a channel 22. The receiver 23 can include the equalizer 24, a gain stages block 25 and a data recovery circuit 26. The attenuation of the high frequency components of the received signal is comparatively higher than the low frequency counterparts. This can be attributed to the low pass characteristics of the communication channel 22 through which the received signal traverses. The equalizer 24 can be used for countering effects of inter-symbol interference due to low-pass characteristics of the channel 22. The equalizer 24 can include a circuit 200. The circuit 200 attempts to boost the gain of the high frequency components of the received signal relative to the gain of the low frequency components of the received signal. The data recovery circuit 26 can include additional equalizers for further removing the inter-symbol interference and losses due to impedance discontinuities.

Figure 2B:
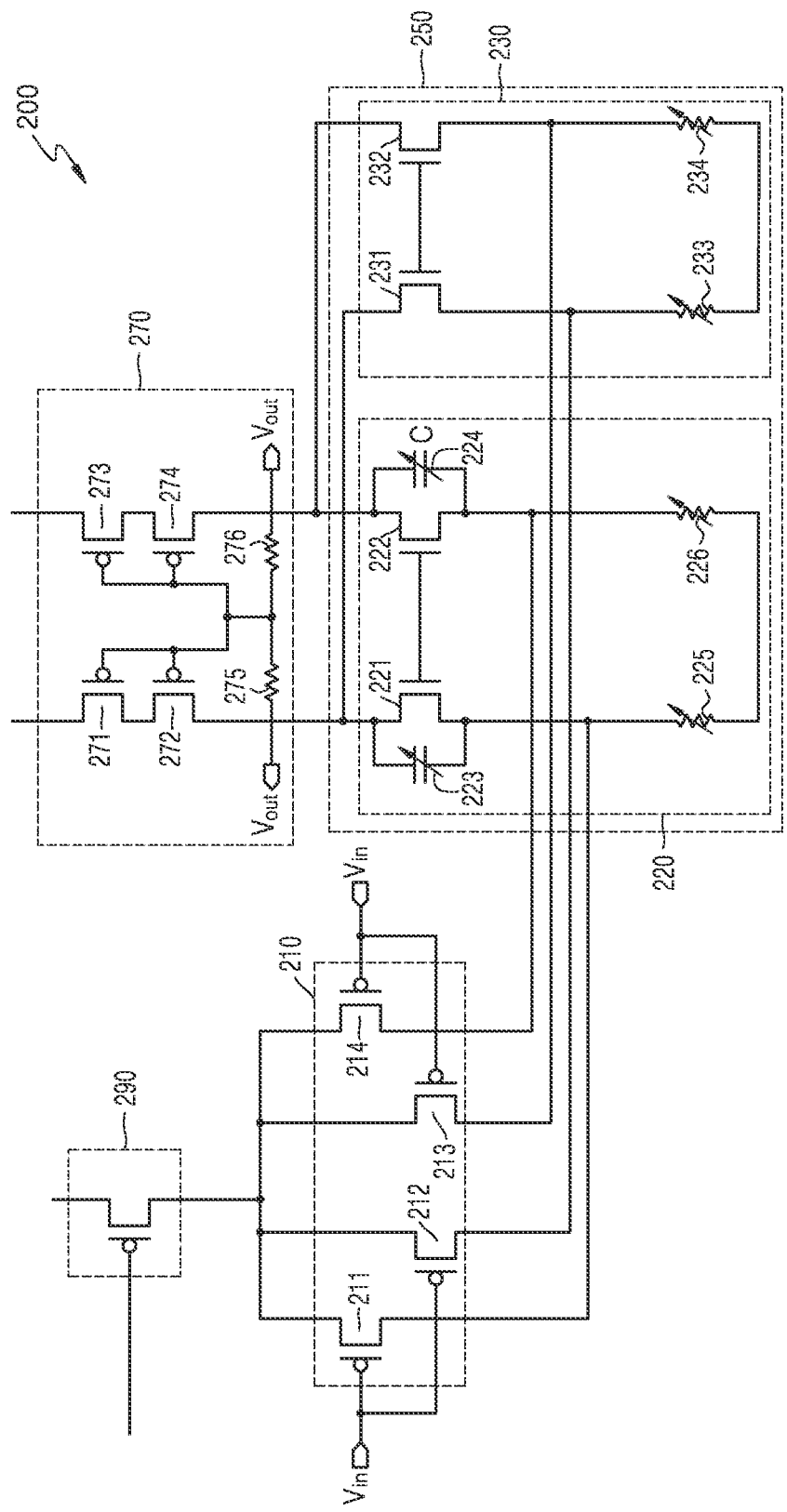
FIG. 2B depicts a circuit included in an equalizer of the receiver communication device that boosts the gain of the high frequency components relative to low frequency components of the received signal.

FIG. 2B depicts the circuit 200 included in the equalizer 24 for boosting the gain of the high frequency components of the received signal relative to low frequency components of the received signal. The circuit 200 includes a differential pair 210 and a split folded cascode amplifier 250. The architecture of the folded cascode amplifier can be split into a derivative path 220 (which may be referred to as a derivative circuit) and a proportional path 230 (which may be referred to as an adjusting circuit). The split folded cascode amplifier 250 can act as a continuous time linear equalizer, which can boost the high frequency components of a received signal attenuated due to low pass characteristics of the communication channel 22.

In an embodiment, the differential pair 210 comprises Metal Oxide Semiconductor Field Effect Transistors (MOSFET) M1. Each leg of the differential pair 210 comprises of two MOSFETs 211 and 212 (or, 213 and 214). The MOSFETs 211 and 212 (or, 213 and 214) forming the differential pair 210 may be identical to each other to a maximum possible extent. For sake of simplicity of the description, it can be assumed that the MOSFETs 211 and 212 (or, 213 and 214) forming the differential pair 210 are identical. The received signal is fed as an input signal to the gate terminals of each of the MOSFETs 211 and 212 (or, 213 and 214) in the differential pair 210, which converts a difference of input signal voltages to a differential current and feeds a voltage/current to the proportional path 230 and the derivative path 220. In an exemplary embodiment, the differential pair 210 may use a P-channel MOSFET as a MOSFETs 211 and 212 (or, 213 and 214). In this case, the PMOS transistors 211 and 214 may be considered a first PMOS group connected to the derivative path 220, and the PMOS transistors 212 and 213 may be considered a second PMOS group connected to the proportional path 230. Here, as shown in FIG. 2B, the first and second PMOS groups are connected in parallel, and the derivative path 220 and the proportional path 230 are connected to the differential circuit 210 in parallel. Also, as previously mentioned, the derivative path 220 may be considered a boosting circuit, and the proportional path 230 may be considered an adjusting circuit.

In the present disclosure, as a MOSFET, a P-channel MOSFET or an N-channel MOSFET may be used, but the present disclosure is not limited thereto. For convenience of explanation, hereinafter, a MOSFET is described without classifying the type (channel) of MOSFET, but an N-channel MOSFET or a P-channel MOSFET is exemplified as needed.

The derivative path 220 and the proportional path 230 are connected to common load 270. The common load 270 comprises four identical MOSFETs 271, 272, 273 and 274 and two resistors 275 and 276, having identical values. The resistors 275 and 276 provide a Common Mode Feedback (CMFB) to the MOSFETs 271, 272, 273 and 274 to define an operating point. It can be noted that boosting a gain of high frequencies relative to low frequencies can be achieved using other forms of active loads instead of the active load shown in the embodiments.

The derivative path 220 comprises two MOSFETs 221 and 222 and two variable capacitors 223, and 224. Each leg of the derivative path 220 includes a MOSFET 221 (or 222) and the MOSFETs 221 and 222 in each leg are identical. The derivative path 220 includes capacitors 223 and 224, which are connected between the source terminal and the drain terminal of the respective identical MOSFETs 221 and 222. The capacitors 223 and 224 in the different legs of the derivative path 220 are identical. The capacitors 223 and 224 in the legs of the derivative path 220 can provide very high impedance to the low frequency components. The capacitors 223 and 224 in the legs of the derivative path 220 can provide very low impedance to the high frequency components of the input signal (i.e., Vin). Each leg of the derivative path 220 includes a resistor 225 (or 226). The resistors R2 included in the legs of the derivative path 220 are identical. In an exemplary embodiment, the derivative path 220 may use a N-channel MOSFET as a MOSFETs 221 and 222.

The value (resistance) of the resistor 225 (or 226) is based on the impedance seen at the source terminals of the MOSFETs 221 and 222, which is approximately $1/g_{M2}$ ($g_{M2}$ is the transconductance of the MOSFETs 221 and 222). The value (resistance) of the resistor 225 (or 226) is chosen such that $1/g_{M2}$ is greater than the resistor 225 or 226. This will impel a greater flow of current through the resistors 225 and 226 compared to the MOSFETs 221 and 222 at low frequencies.

When low frequency components are fed as input, the capacitors 223 and 224 present greater impedance. For a Direct Current (DC) input, the impedance presented by the capacitor 223 (or 224) is close to infinity. Therefore, the current in the derivative path 220 flows through MOSFET 221 (or 222) and the resistor 225 (or 226). The impedance at the terminals of MOSFET 221 (or 222) is a parallel combination of $1/g_{M2}$ and $X_C$, wherein $X_C$ is the impedance of the capacitor 223 (or 224). The impedance is approximated as $1/g_{M2}$, because the value of $1/g_{M2}$ is insignificant compared to $X_C$ at low frequencies. Further, the greater $1/g_{M2}$ is to the resistor 225 (or 226), the lesser the current flowing through the drain and source terminals of MOSFET 221 (or 222) (e.g., $I_{M2}$) will be to the current flowing through the resistor 225 (or 226) (e.g., $I_{R2}$). The boosting of the high frequency components is directly proportional to $I_{R2}/I_{M2}$. If the difference between $I_{R2}$ and $I_{M2}$ is high ($I_{R2}$ being greater than $I_{M2}$), the ratio $I_{R2}/I_{M2}$ increases.

When the input signal includes high frequency components, the capacitors 223 ad 224 present low impedance. The impedance at the terminals of the MOSFET 221 (or 222) can be approximated as $X_C$. As the current flowing through resistor 225 (or 226) is greater than the current flowing through the MOSFET 221 (or 222) at low frequencies, a greater amount of current can be steered from the resistor 225 (or 226) to the capacitor 223 (or 224) when the input signal (e.g., Vin) includes high frequency components. The greater the value of $1/g_{M2}$ is to the resistance of the resistor 225 (or 226), or $I_{R2}$ is to $I_{M2}$, the greater is the amount of current steered from the resistor 225 (or 226) through the capacitors 223 and 224 in the legs of the derivative path 220. The steering of current from the resistors 225 and 226 to the capacitors 223 and 224 allows boosting of the gain of the high frequency components. Therefore, the degree of boost is proportional to the ratio $I_{R2}/I_{M2}$.

The capacitance of the capacitor 223 (or 224) may be referred to as C. The frequencies at the input, which are greater than the $g_{M2}/C$ frequency, can be boosted ($g_{M2}/C$ is 'zero' in a transfer function of gain). The $g_{M2}/C$ will be referred to as a 'zero' frequency. The frequency at which the gain is maximum can be referred to as peak gain frequency. Thus, the derivative path 220 can be utilized for boosting the gain of the high frequency components of the input signal. Therefore, the derivative path 220 can be referred to as a boosting circuit.

The proportional path 230 comprises two MOSFETs 231 and 232, which are identical. Each leg of the proportional path 230 can include a variable resistor 233 (or 234). The variable resistors 233 and 234 included in the legs of the proportional path 230 are identical. The proportional path 230, which operates independent of the derivative path 220, allows adjusting of the DC gain and an amount of low frequency to high frequency boosting of the input signal without affecting the 'zero' frequency and peak gain frequency. In an exemplary embodiment, the derivative path 220 may use a N-channel MOSFET as a MOSFETs 231 and 232.

The capacitors 223 and 224 in the derivative path 220 and the variable resistors 233 and 234 in the proportional path 230 can be adjusted to ensure that the peak gain frequency remains constant. Due to process corner variations across multiple fabrication lots, the 'zero' and peak gain frequency of the transfer function of the split folded cascode may vary from predetermined values. In order to counter the deviation due to process variations, the values of the capacitors 223 and 224 and resistors 233 and 234 in the derivative path 220 need to be adjusted for each process corner. The adjustment can ensure that the peak gain frequency and 'zero' frequency remains fixed. The values (resistance) of the resistors 233 and 234 in the proportional path 230 can be adjusted to get a desired low frequency to peak frequency gain ratio. Therefore, the proportional path 230 can be referred to as an adjusting circuit.

The derivative path 220 allows boosting of the gain of the high frequency components; and the proportional path 230 allows adjusting of the gain of the low frequency components of the input signal, while a gain of the high frequency components is boosted by the derivative path 220. Therefore, the derivative path 220 and the proportional path 230 allow independent optimization of the high frequency components and the low frequency components.

The splitting of the architecture of the folded cascode amplifier into the derivative path 220 and proportional path 230 can prevent source degeneration in the MOSFETs 211-214 of the differential pair 210 and allow the differential pair 210 to have a single current source 290. This can eliminate input referred offset due to a mismatch, which occurs if the current source 290 is split.

FIG. 2B shows exemplary blocks of the circuit 200, but it is to be understood that other embodiments are not limited thereon. In other embodiments, the circuit 200 may include less or more blocks. In addition, in the present disclosure, it has been illustrated that P-MOS is used for the differential pair 210, and N-MOS is used for the derivative path 220 (or the proportional path 230), but the present disclosure is not limited thereto. Considering the characteristics of a MOSFET, it should be understood that the differential pair 210 and the derivative path 220 (or the proportional path 230) may use MOSFETs of opposite polarities (type of MOSFET). For example, an N-MOS may be used for a differential pair 210, and a P-MOS may be used for the derivative path 220 (or the proportional path 230). Further, the labels or names of the blocks are used only for illustrative purpose and do not limit the scope of the invention. One or more blocks can be combined together to perform the same or substantially similar function in the circuit 200.

Figure 3:
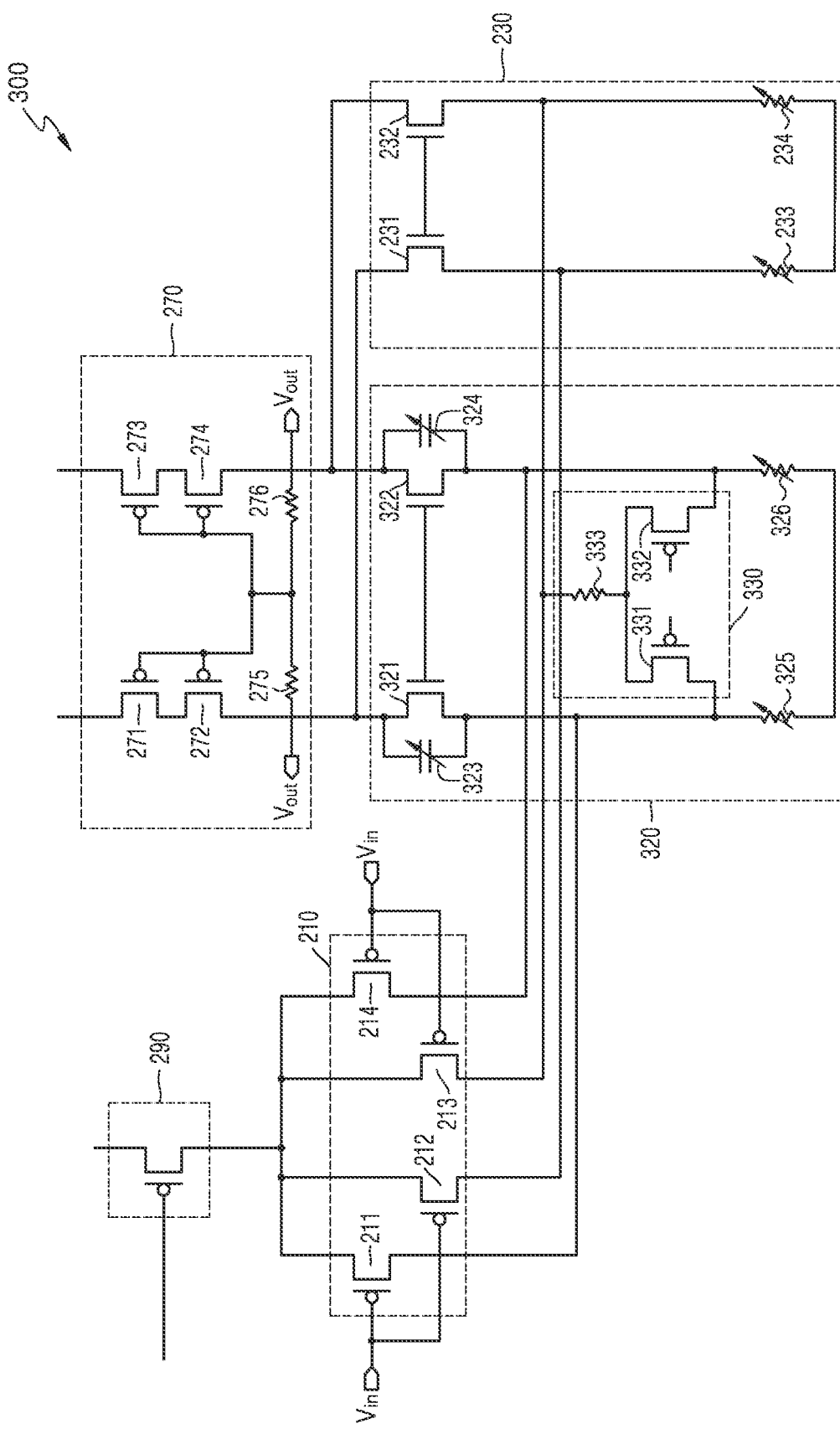
FIG. 3 depicts another circuit comprising an equalizer for boosting high frequency components of a received signal relative to low frequency components of the received signal.

FIG. 3 depicts a circuit 300 comprising an equalizer that boosts the gain of the high frequency components of a received signal relative to low frequency components of the received signal. The circuit 300 comprises a differential pair 210 and a folded cascode amplifier, wherein the architecture of the folded cascode amplifier is split into a derivative path 320 and a proportional path 230. The folded cascode amplifier includes a cross-couple booster 330. The cross-couple booster 330 can facilitate further boosting (compared to the circuit 200 discussed in FIG. 2B) of the gain of the high frequency components of the received signal.

The differential pair 210 comprises of two legs, wherein each leg comprises of two MOSFETs 211 and 212 (or, 213 and 214). The received signal can be fed as an input signal (e.g., Vin) to the gate terminals of each of the MOSFETs 211 and 212 (or, 213 and 214). The derivative path 320 comprises two legs, each leg comprising a MOSFET 321 (or 322), a variable capacitor 323 (or 324) and a variable resistor 325 (or 326). The MOSFETs 321 and 322, capacitors 323 and 324, and resistors 325 and 326 in each of the two legs are identical. The value (resistance) of the variable resistor 325 (or 326) is chosen such that $1/g_{M2}$ is greater than the variable resistor 325 (or 326), wherein $g_{M2}$ is the transconductance of the MOSFETs 321 and 322. This will impel a greater flow of current through the resistors 325 and 326 compared to the MOSFETs 321 and 322 at low frequencies. The capacitance of the capacitor 323 (or 324) may be referred to as C.

When low frequency components are fed as input, the capacitors 323 and 324 present greater impedance. For DC input, the impedance presented by the capacitor 323 (or 324) is close to infinity. Therefore, the current in the derivative path 320 flows through the MOSFET 321 (or 322) and the variable resistor 325 (or 326). The impedance at the terminals of the MOSFET 321 (or 322) is a parallel combination of $1/g_{M2}$ and $X_C$, wherein $X_C$ is the impedance of the capacitor 323 (or 324). The impedance is approximated as $1/g_{M2}$, because the value of $1/g_{M2}$ is insignificant compared to $X_C$ at low frequencies. Further, the greater $1/g_{M2}$ is to the variable resistor 325 (or 326), the lesser the current flowing through the drain and source terminals of the MOSFET 321 (or 322) (e.g., $I_{M2}$) will be than the current flowing through the variable resistor 325 (or 326) (e.g., $I_{R2}$). The boosting of the high frequency components is directly proportional to $I_{R2}/I_{M2}$. If the difference between $I_{R2}$ and $I_{M2}$ is high ($I_{R2}$ being greater than $I_{M2}$), the ratio $I_{R2}/I_{M2}$ increases.

When the input high frequency components are fed as input, the capacitors 323 and 324 present lesser impedance. As the current flowing through the variable resistor 325 (or 326) is greater than the current flowing through the MOSFET 321 (or 322), a greater amount of current can be steered from the resistor 325 (or 326) to the capacitor 323 (or 324) when the input signal includes high frequency components. The greater the value of $1/g_{M2}$ is to the resistance of the variable resistor 325 (or 326); the greater is the amount of current steered from the variable resistor 325 (or 326) through the capacitor 323 (or 324) in the legs of the derivative path 320. The steering of current from the resistors 325 and 326 to the capacitors 323 and 324 allows boosting of the gain of the high frequency components. Therefore, the degree of boost is proportional to the ratio $I_{R2}/I_{M2}$. The 'zero' frequency is $g_{M2}/C$, wherein frequencies greater than this frequency are boosted.

The proportional path 230 comprises two identical MOSFETs 231 and 232. Each leg of the proportional path 230 can include a variable resistor 233 (or 234). The variable resistors 233 and 234 included in the legs of the proportional path 330 are identical. The proportional path 230 allows adjusting of the gain of the low frequency components of the input signal and hence an amount of low frequency to high frequency boosting of the input signal without affecting the 'zero' frequency and peak gain frequency.

The differential output signals are connected in crisscross as inputs to the cross-couple booster 330 thereby providing positive feedback. Due to the positive feedback, the cross-couple booster 330 can quicken the output transition, i.e., process the signal such that the transition takes place within a lesser time interval. The transitions of the output signal are high frequency phenomena and, by quickening the transitions, the cross-couple booster 330 boosts high frequency components.

Direct current from the cross-couple booster 330 flows only through the variable resistor 325 (or 326) (not MOSFET 331 (or 332)). Therefore $I_{R2}/I_{M2}$ can be increased without affecting the impedance of the MOSFETs $1/g_{M2}$. The impedance seen at the cross couple booster 330 is much higher compared to the resistance $R_2$ of the variable resistor 325 (or 326). Hence $(1/g_{M2})/R_{2eff}$ is approximately equal to $(1/g_{M2})/R_2$. Because the boosting high frequency components is proportional to $I_{R2}/I_{M2}$ and $(1/g_{M2})/R_2$, the boosting of the high frequency components is improved due to the presence of the cross-couple booster 330 (because $I_{R2}/I_{M2}$ becomes greater due to the increase in $I_{R2}$ without impacting $(1/g_{M2})/R_2$).

FIG. 3 shows exemplary blocks of the circuit 300, but it is to be understood that other embodiments are not limited thereon. In other embodiments, the circuit 300 may include less or more blocks. Further, the labels or names of the blocks are used only for illustrative purpose and do not limit the scope of the invention. One or more blocks can be combined together to perform the same or substantially similar function in the circuit 300.

Figure 4:
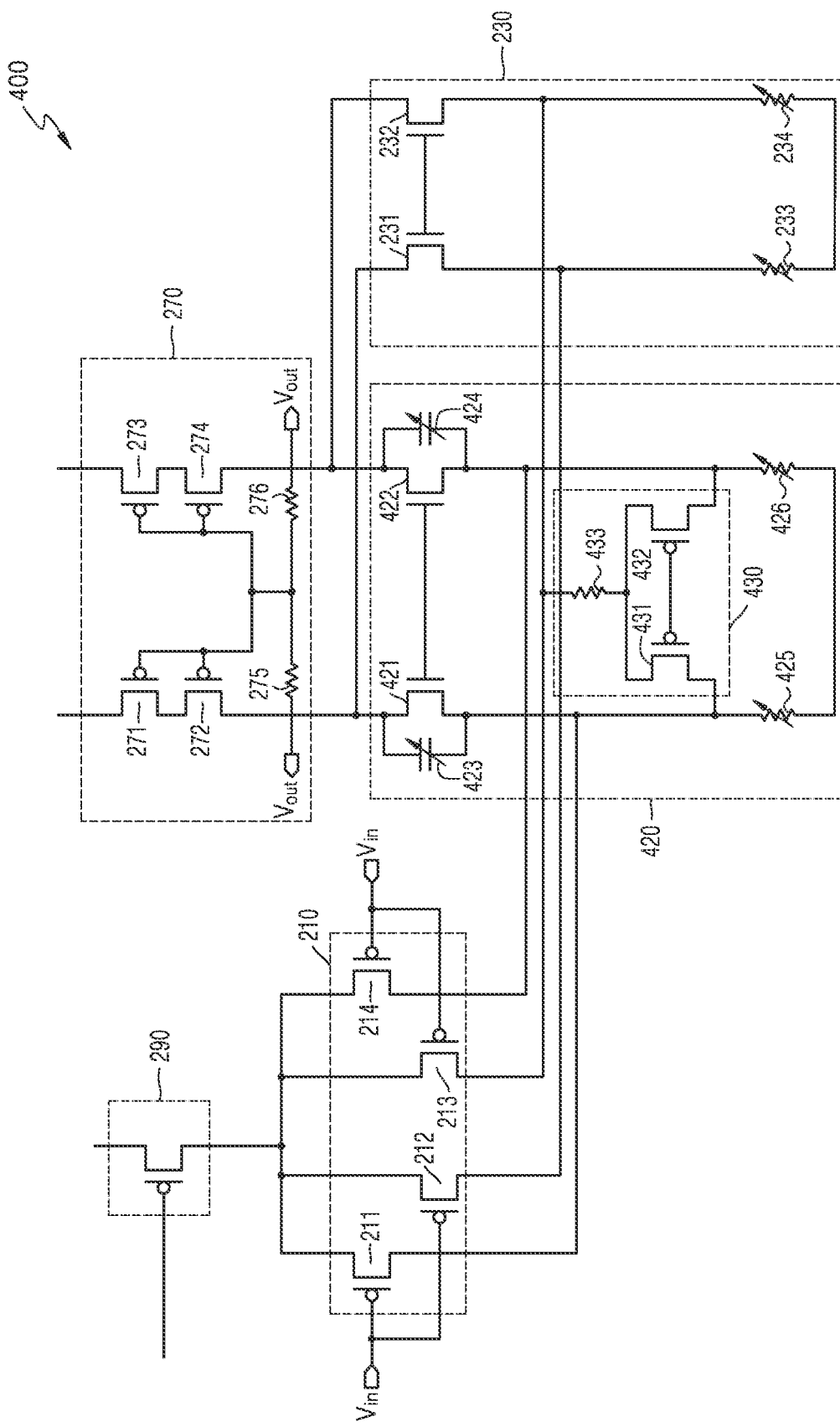
FIG. 4 depicts yet another circuit comprising an equalizer for boosting high frequency components of a received signal relative to low frequency components of the received signal.

FIG. 4 depicts a circuit 400 comprising an equalizer, which boosts the gain of the high frequency components of the received signal relative to low frequency components of the received signal, according to embodiments as disclosed herein. As depicted in FIG. 4, the circuit 400 comprises a differential pair 210 and a folded cascode amplifier, wherein the architecture of the folded cascode amplifier is split into a derivative path 420 and a proportional path 230. The folded cascode amplifier includes a booster 430. The booster 430 can facilitate further (compared to the circuit 200 discussed in FIG. 2B) boosting of the high frequency components of the received signal.

The differential pair 210 comprises of two legs, wherein each leg comprises of two MOSFETs 211 and 212 (or, 213 and 214). The received signal can be fed as an input signal to the gate terminals of each of the MOSFETs 211 and 212 (or, 213 and 214). The derivative path 420 comprises two legs, each leg comprising a MOSFET 421 (or 422), a variable capacitor 423 (or 424) and a variable resistor 425 (or 426). The MOSFETs 421 and 422, capacitors 423 and 424, and resistors 425 and 426 in each of the two legs are identical. The value (resistance) $R_2$ of the resistor 425 (or 426) is chosen such that $1/g_{M2}$ is greater than $R_2$, wherein $g_{M2}$ is the transconductance of the MOSFETs 421 and 422. This will impel a greater flow of current through the resistors 425 and 426, compared to the MOSFETs 421 and 422 at low frequencies.

When low frequency components are fed as input, the capacitors 423 and 424 present greater impedance. For a DC input, the impedance presented by the capacitors 423 and 424 is close to infinity. Therefore, the current in the derivative path 420 flows through the MOSFET 421 (or 422) and the resistor 425 (or 426). The impedance at the terminals of the MOSFET 421 (or 422) is a parallel combination of $1/g_{M2}$ and $X_C$, wherein $X_C$ is the impedance of the capacitor. The impedance is approximated as $1/g_{M2}$, because the value of $1/g_{M2}$ is insignificant compared to $X_C$ at low frequencies. Further, because $1/g_{M2}$ is greater than the resistance $R_2$ of the resistor 425 (or 426), the current flowing through the drain and source terminals of the MOSFET 421 (or 422) (e.g., $I_{M2}$) will be less than the current that will flow through the resistor $R_2$ (e.g., $I_{R2}$). The boosting of the high frequency components is directly proportional to $I_{R2}/I_{M2}$. If the difference between $I_{R2}$ and $I_{M2}$ is high ($I_{R2}$ being greater than $I_{M2}$), the ratio $I_{R2}/I_{M2}$ increases.

When the input high frequency components are fed as input, the capacitors 423 and 424 present lesser impedance. Because the current flowing through the resistor 425 and 426 is greater than the current flowing through the MOSFET 421 (or 422), a greater amount of current can be steered from the resistor 425 (or 426) to the capacitor 423 (or 424) when the input signal includes high frequency components. The greater the value of $1/g_{M2}$ is to the resistance $R_2$ of the resistor 425 (or 426), the greater is the amount of current steered from the resistor 425 (or 426) through the capacitors 423 (or 424) in the legs of the derivative path 420. The steering of current from the resistors 425 and 426 to the capacitors 423 and 424 allows boosting of the gain of the high frequency components. The capacitance of the capacitor 423 (or 424) can be referred to as 'C' hereto. Therefore, the degree of boost is proportional to the ratio $I_{R2}/I_{M2}$ at DC. The 'zero' frequency is $g_{M2}/C$, wherein frequencies greater than the 'zero' frequency are boosted.

The proportional path 230 comprises of two identical MOSFETs 231 and 232. Each leg of the proportional path 230 can include a variable resistor 233 (or 234). The variable resistors 233 and 234 included in the legs of the proportional path 230 are identical. The proportional path 230 allows adjusting of the gain of the low frequency components of the input signal and hence an amount of low frequency to high frequency boosting of the input signal without affecting the 'zero' frequency and peak gain frequency.

The output common mode voltage (from the MOSFETs 271, 272, 273 and 274 and resistors 275 and 276) is fed to the booster 430. The output common mode voltage acts as a bias voltage for the booster 430. The direct current from the booster 430 flows only through the resistor 425 and 426 (and not MOSFET 421 and 422). Therefore, the ratio $I_{R2}/I_{M2}$ can be increased without affecting the impedance of the MOSFETs $1/g_{M2}$. The impedance seen at the booster 430 is higher compared to the resistance $R_2$ of the resistor 425 (or 426). Hence $(1/g_{M2})/R_{2eff}$ is approximately equal to $(1/g_{M2})/R_2$. Because the boosting of the high frequency components is proportional to $I_{R2}/I_{M2}$ and $(1/g_{M2})/R_2$, the boosting of the high frequency components is improved due to the presence of the booster 430 (because $I_{R2}/I_{M2}$ becomes greater due to the increase in $I_{R2}$ without impacting $(1/g_{M2})/R_2$).

FIG. 4 shows exemplary blocks of the circuit 400, but it is to be understood that other embodiments are not limited thereon. In other embodiments, the circuit 400 may include less or more blocks. Further, the labels or names of the blocks are used only for illustrative purpose and do not limit the scope of the invention. One or more blocks can be combined together to perform same or substantially similar function in the circuit 400.

Figure 5:
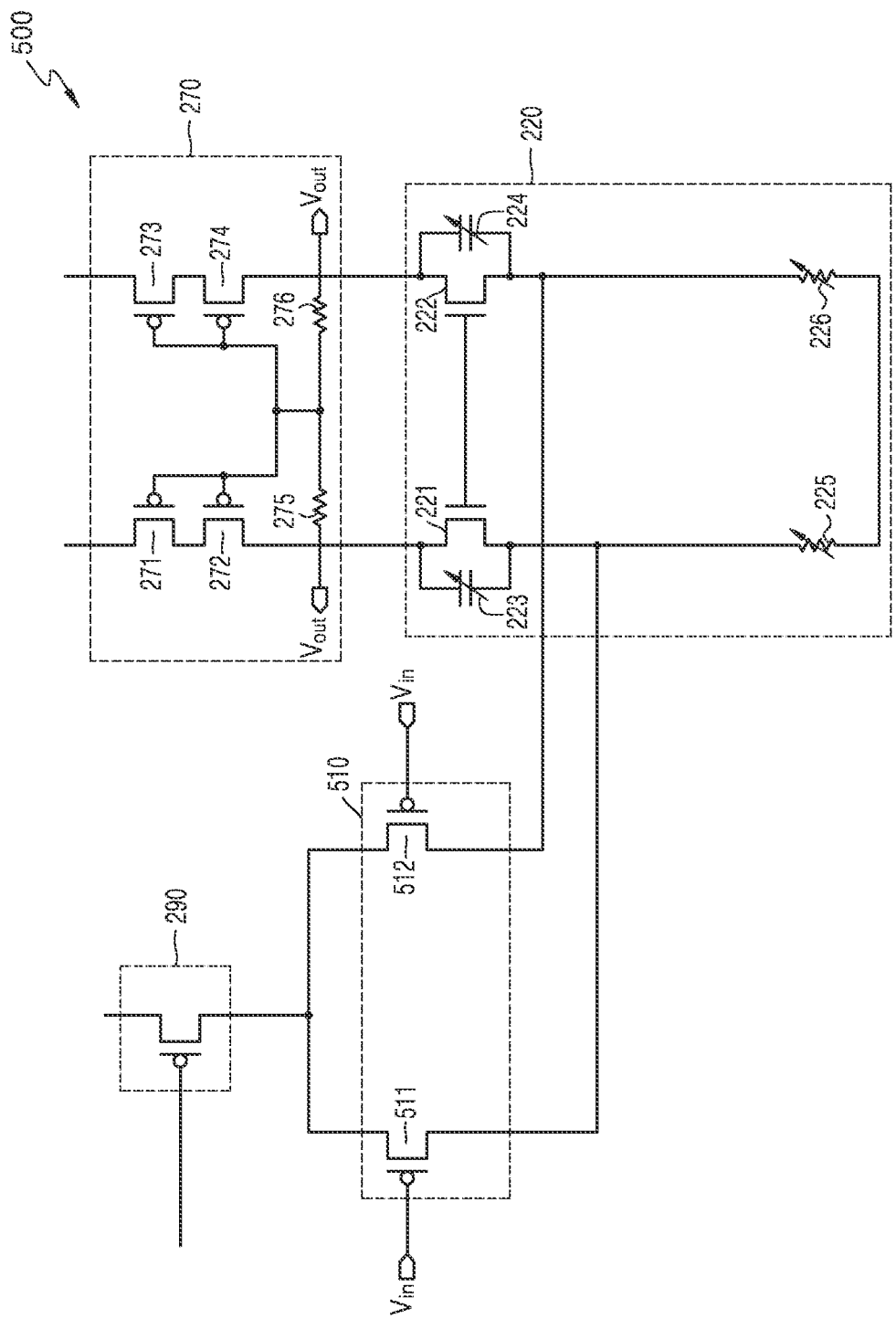
FIG. 5 depicts a circuit for boosting the gain of high frequency components of a received signal relative to low frequency components of the received signal.

FIG. 5 depicts a circuit 500 for boosting the gain of the high frequency components of the received signal relative to low frequency components of the received signal. As depicted in FIG. 5, the circuit 500 comprises a differential pair 510 and a folded cascode amplifier having a derivative path 220. The derivative path 220 allows boosting of the gain of the high frequency components of a received signal, which are attenuated due to low pass characteristics of the communication channel 22.

The performance of the folded cascode amplifier can be improved non-intrusively by the inclusion of the variable capacitors 223 and 224 connected across the drain and source terminals of the MOSFETs 221 and 222 at a folding node (which transforms the folding branch to the derivative path 220), without affecting existing DC bias conditions and with a minimal layout effort. The capacitors 223 and 224 in the derivative path 220 can aid in achieving an improvement in the transient performance because capacitor 223 (or 224) will boost the high frequency components.

The power consumption of the equalizer and the circuit 200 is significantly lower compared to the power consumption of a conventional Continuous Time Linear Equalizer (CTLE).

The embodiments disclosed herein can be implemented through at least one software program running on at least one hardware device and performing network management functions to control the network elements. The network elements shown in FIG. 2A include blocks which can be at least one of a hardware device, or a combination of hardware device and software module.

The embodiments disclosed herein describe an equalizer having split folded cascode architecture, wherein the equalizer boosts the gain of high frequency components of a received signal, which are attenuated due to low-pass characteristics of a communication channel.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

What is claimed is:

1. A circuit comprising:
   a differential pair connected to a current source and configured to receive an input signal; and
   a split folded cascode amplifier connected to the differential pair and configured to boost a gain of high frequency components of the input signal relative to a gain of low frequency components of the input signal.

2. The circuit of claim 1, wherein:
   the split folded cascode amplifier comprises a derivative path and a proportional path,
   the derivative path and the proportional path are connected to the differential pair in a parallel combination,
   the derivative path is configured to boost the gain of the high frequency components of the input signal, and
   the proportional path is configured to adjust the gain of the low frequency components of the input signal so as to increase a ratio of the gain of the high frequency components with respect to the gain of the low frequency components.

3. The circuit of claim 2, wherein:
   the derivative path comprises two legs, each leg comprising a MOSFET, a variable resistor, and a variable capacitor,
   the split folded cascode amplifier boosts the gain of the high frequency components directly proportional to a ratio of current flowing through the MOSFET in each of the legs with respect to current flowing through the variable resistor in the leg, and the gain of the high frequency components is directly proportional to current steered from the variable resistor in each of the legs to the variable capacitor in the leg.

4. The circuit of claim 3, wherein current is steered in each of the legs in response to a magnitude of transconductance of the MOSFET in each of the legs being less than a magnitude of resistance of the variable resistor in the leg.

5. The circuit of claim 3, wherein:
   the variable capacitors in the derivative path are adjusted to fix a 'zero' frequency to a predetermined value, and
   frequencies greater than the 'zero' frequency are boosted by the derivative path.

6. The circuit of claim 3, wherein the variable resistors in the derivative path are adjusted to fix a 'peak gain' frequency to a predetermined value.

7. The circuit of claim 3, further comprising a booster that is connected to the MOSFET in each of the legs.

8. The circuit of claim 7, wherein the booster is configured to boost the gain of the high frequency components by:
   increasing a ratio of current flowing through the variable resistor in each of the legs with respect to current flowing through the MOSFET in the leg, or
   providing a positive feedback to boost the gain of the high frequency components.

9. The circuit of claim 2, wherein the proportional path comprises two legs, each leg comprises a MOSFET and a variable resistor.

10. A circuit comprising:
    a differential pair comprising a first Metal Oxide Semiconductor Field Effect Transistor (MOSFET) group connected to a first input signal, and a second MOSFET group connected to a second input signal;
    a proportional path comprising a first MOSFET, a variable capacitor, and a first variable resistor, and connected to the first MOSFET group and the second MOSFET group; and
    a derivative path comprising a second MOSFET, a second variable resistor and connected to the first MOSFET group and the second MOSFET group.

11. The circuit of claim 10, wherein:
    the first MOSFET group and the second MOSFET group are connected in a parallel combination, and
    the derivative path and the proportional path are connected to the differential pair in a parallel combination.

12. The circuit of claim 10, wherein:
    the variable capacitor is connected between a source terminal and a drain terminal of the first MOSFET, and
    the first variable resistor is connected to either the source terminal or the drain terminal of the first MOSFET.

13. The circuit of claim 10, wherein:
    the first MOSFET group comprises a third MOSFET and a fourth MOSFET,
    the second MOSFET group comprises a fifth MOSFET, and a sixth MOSFET,
    the third MOSFET and the fifth MOSFET are connected to the derivative path, and
    the fourth MOSFET and the sixth MOSFET are connected to the proportional path.

14. The circuit of claim 13, wherein:
    the derivative path comprises two legs, each leg comprises the first MOSFET, the first variable resistor, and the variable capacitor,
    the proportional path comprises two legs, each leg comprises the second MOSFET, the second variable resistor, the third MOSFET is connected to the one of the leg of the derivative path, the sixth MOSFET is connected to the other of the leg of the derivative path, the fourth MOSFET is connected to the one of the leg of the proportional path, and the fifth MOSFET is connected to the other of the leg of the proportional path.

15. The circuit of claim 14, the derivative path further comprising a booster connected to the first MOSFET, and configured to boost a gain of high frequency components by:

increasing a ratio of current flowing through the first variable resistor in each of the legs with respect to current flowing through the MOSFET in the leg, or providing a positive feedback to boost the gain of the high frequency components.

16. A gain boost circuit comprising:

a differential pair circuit comprising a first P-channel Metal Oxide Semiconductor (PMOS) group and a second PMOS group;

a boosting circuit comprising a first N-channel Metal Oxide Semiconductor (NMOS) transistor, a variable capacitor and a first variable resistor, and connected to the differential pair circuit; and an adjusting circuit comprising a second NMOS transistor, a second variable resistor and connected to the differential pair circuit.

17. The gain boost circuit of claim 16, wherein:

the boosting circuit is configured to boost a gain of high frequency components of an input signal, and the adjusting circuit is configured to adjust a gain of low frequency components of the input signal so as to increase a ratio of the gain of the high frequency components with respect to the gain of the low frequency components.

18. The gain boost circuit of claim 16, wherein:

the first PMOS group and the second PMOS group are connected in a parallel combination, and the boosting circuit and the adjusting circuit are connected to the differential pair circuit in a parallel combination.

19. The gain boost circuit of claim 16, wherein:

the first PMOS group comprises a first PMOS transistor and a second PMOS transistor, the second PMOS group comprises a third PMOS transistor, and a fourth PMOS transistor, the boosting circuit is connected to the first PMOS transistor and the third PMOS transistor, and the adjusting circuit is connected to the second PMOS transistor and the fourth PMOS transistor.

20. The gain boost circuit of claim 16, the boosting circuit further comprising a booster, wherein the booster is configured to boost a gain of high frequency components by increasing a ratio of current flowing through the first variable resistor with respect to current flowing through the first NMOS transistor or by providing a positive feedback.

* * * * *